United States Patent [19]
Sato et al.

[11] Patent Number: 5,499,099
[45] Date of Patent: Mar. 12, 1996

[54] ALIGNMENT METHOD AND ALIGNMENT SYSTEM

[75] Inventors: Makoto Sato, Tokyo; Shigeyuki Uzawa, Utsunomiya, both of Japan

[73] Assignee: Canon Kabushiki Kaisha, Tokyo, Japan

[21] Appl. No.: 202,064

[22] Filed: Feb. 25, 1994

[30] Foreign Application Priority Data

Feb. 25, 1993 [JP] Japan ................................. 5-059330

[51] Int. Cl.⁶ ................................................. G01B 11/00
[52] U.S. Cl. ........................ 356/400; 356/401; 250/548; 355/53
[58] Field of Search ................................. 356/363, 401, 356/400; 250/492.2, 548; 355/53

[56] References Cited

U.S. PATENT DOCUMENTS

| | | | |
|---|---|---|---|
| 4,659,227 | 4/1987 | Sato et al. | 356/401 |
| 4,780,617 | 10/1988 | Umatate et al. | 250/548 |
| 4,792,693 | 12/1988 | Yamaguchi et al. | 356/401 |
| 4,823,012 | 4/1989 | Kosugi | 356/400 |
| 4,833,621 | 5/1989 | Umatate | 356/401 |
| 4,843,563 | 6/1989 | Takahashi et al. | 250/492.2 |
| 4,861,162 | 8/1989 | Ina | 356/400 |
| 4,870,288 | 9/1989 | Abuku et al. | 250/548 |
| 4,918,320 | 4/1990 | Hamasaki et al. | 250/548 |
| 5,112,133 | 5/1992 | Kurosawa et al. | 356/401 |
| 5,142,156 | 8/1992 | Ozawa et al. | 356/400 |
| 5,182,615 | 1/1993 | Kurosawa et al. | 356/400 |

FOREIGN PATENT DOCUMENTS

463534 10/1992 Japan.

Primary Examiner—F. L. Evans
Attorney, Agent, or Firm—Fitzpatrick, Cella, Harper & Scinto

[57] ABSTRACT

An alignment method and system in which substrates having zones, to be aligned and being disposed in a predetermined array, are supplied sequentially and in which in each substrate the zones are brought into alignment with a predetermined reference position sequentially. Deviations in the positions of the zones of a first substrate with respect to positions determined in accordance with the predetermined array, are measured in sequence, and the actual array of the zones through the measurement is detected. The relationship between the predetermined array and the actual array detected in the first step is determined in terms of a predetermined transformation parameter, and a transformation parameter for the first substrate effective to minimize an error, is determined. An error between the actual array and an array determined in accordance with the transformation parameter of the first substrate, is determined and stored, and with respect to the predetermined reference position, a second substrate having zones of substantially the same array as the first substrate is aligned by using the stored error as an alignment correction value.

20 Claims, 11 Drawing Sheets

ALIGNMENT METHOD AND ALIGNMENT SYSTEM

FIELD OF THE INVENTION AND RELATED ART

This invention relates to an alignment method and an alignment system for correctly aligning plural objects with each other. The alignment method or alignment system of the present invention is particularly suitably usable in an apparatus (as an example, a reduction projection type exposure apparatus for projecting an electronic circuit pattern onto a semiconductor substrate) which apparatus needs precise alignment means.

The degree of integration of a semiconductor device, such as a DRAM has increased considerably recently. With the increasing degree of integration, the width of a pattern formed on a semiconductor device has been narrowed to the order of a submicron. In the field of semiconductor exposure apparatuses, many technology developments have been made to improve the precision of alignment of a mask and a wafer. Currently, reduction projection type (stepper type) semiconductor exposure apparatuses are used widely.

Figure 1A:
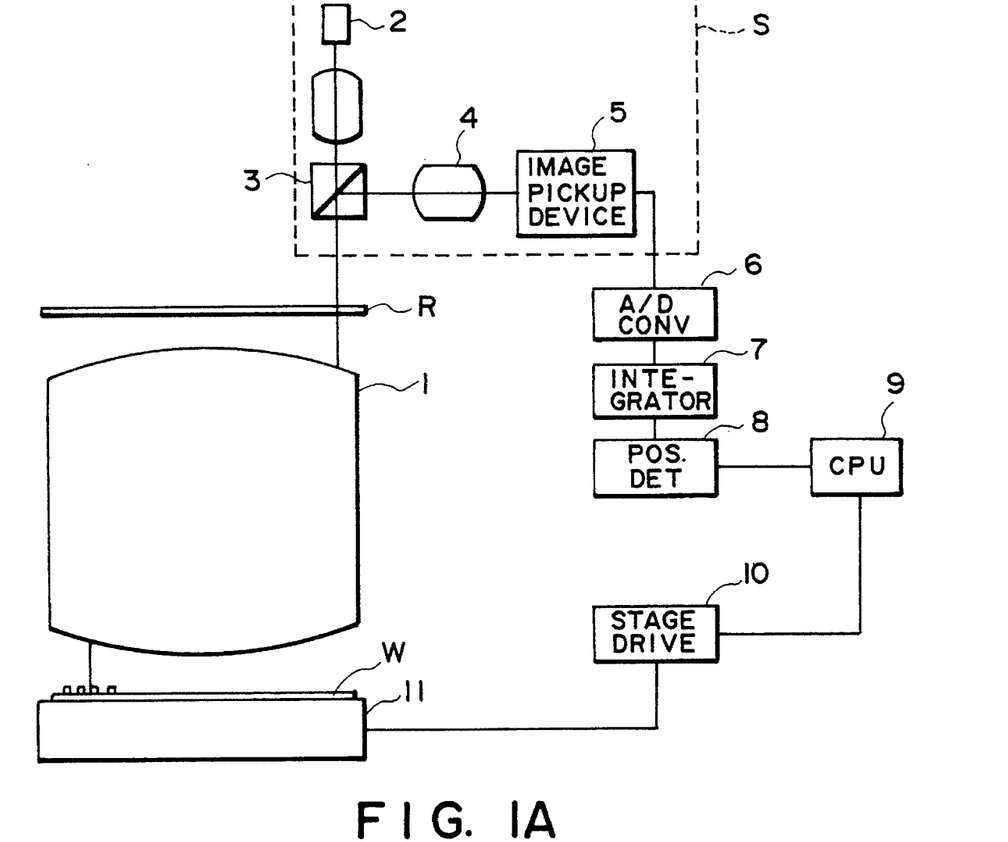
FIG. 1A is a schematic view of a main portion of an alignment system of a known type.

FIG. 1A is a schematic view of an example of a reduction projection type semiconductor exposure apparatus. With exposure light supplied by an exposure illumination system (not shown), an electronic circuit pattern formed on a reticle R is projected, through a projection optical system 1, onto a wafer W for exposure thereof, the wafer being placed on a stage 11 movable two-dimensionally. Denoted at S in the drawing is an alignment optical system which serves to detect the position with respect to the X direction, in this example. A similar alignment optical system (not shown) is provided to detect the position with respect to the Y direction. Prior to the exposure operation, relative alignment of the reticle R and the wafer W is done in the sequence as described below.

Figure 1B:
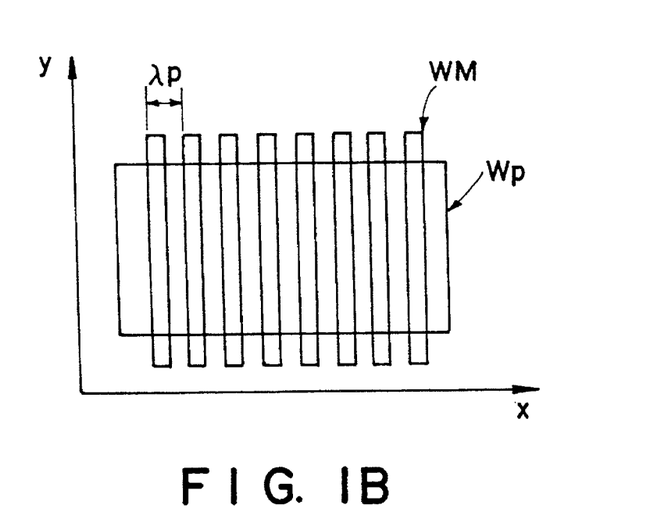
FIG. 1B is an enlarged view of a mark used in the alignment system of FIG. 1A.
Figure 2:
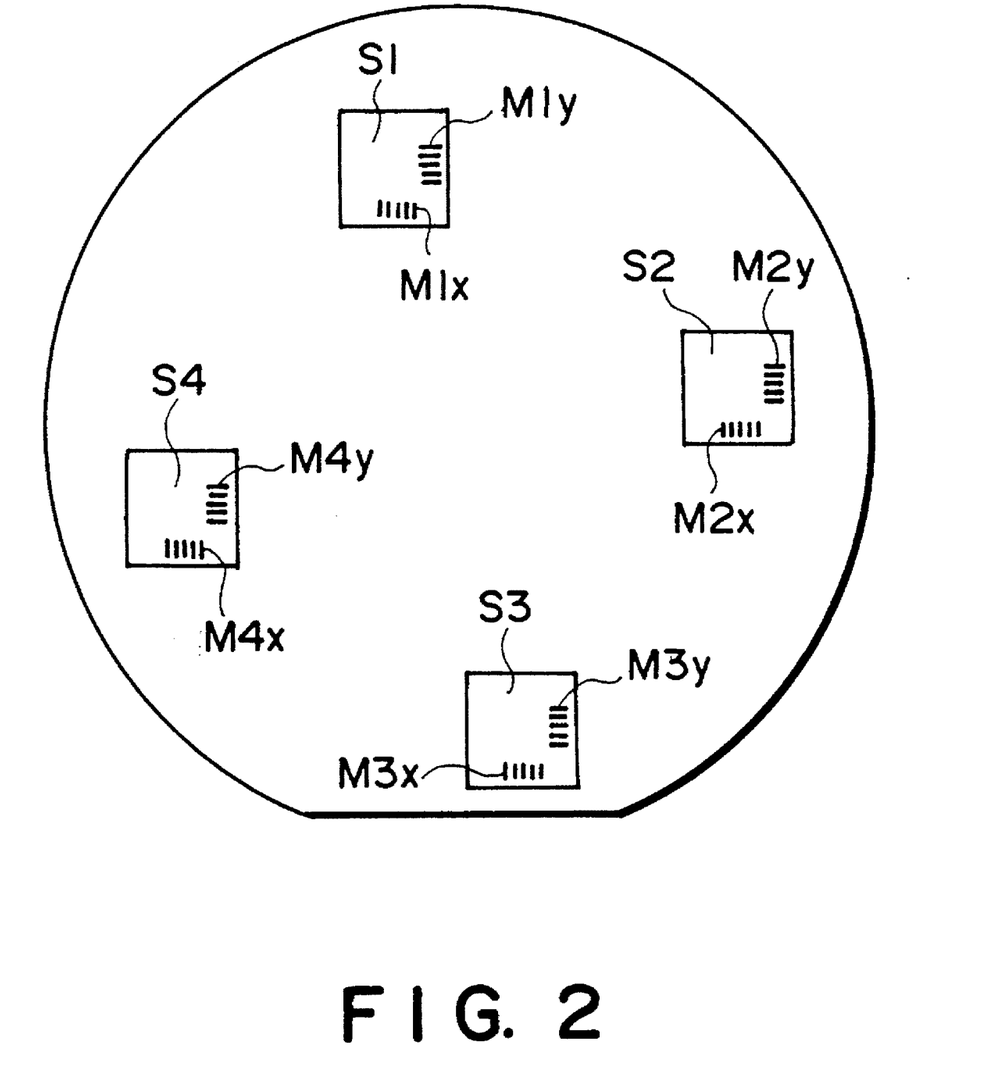
FIG. 2 is a plan view of a wafer, showing sample positions to be measured with the alignment system of FIG. 1A.

The wafer W is moved by means of a wafer conveying device (not shown) onto the X-Y stage 11. In response, a central processing unit (CPU) 9 supplies a command to a stage driving device 10 to cause it to drive the X-Y stage 11, so that an alignment mark M1x, formed in relation to a first measurement shot S1 (FIG. 2), is positioned within the range of the viewfield of the alignment optical system S. Here, a light beam projected by an alignment illumination device 2, providing non-exposure (non-sensitizing) light, passes through a beam splitter 3, the reticle R and the projection optical system 1 and illuminates the alignment mark M1x (hereinafter "wafer mark"). FIG. 1B illustrates the wafer mark M1x. It comprises rectangular patterns of the same shape disposed at a regular pitch $\lambda p$. The light beam reflected by the wafer mark M1x passes again through the projection optical system 1 and the reticle R, and it impinges on the beam splitter. The light beam is reflected by the beam splitter and, through an imaging optical system 4, it forms an image WM of the wafer mark M1x upon an image pickup surface of an image pickup device. With this image pickup device 5, the image of the wafer mark M1x is photoelectrically converted and, by means of an analog-to-digital (A/D) converter 6, it is transformed into a two-dimensional digital signal train. Denoted at 7 in FIG. 1A is an integrating device which serves to define a processing window Wp (FIG. 1B) for the wafer mark image WM having been digitalized by the A/D converter 6. Within the processing window, a moving/averaging operation with respect to the Y direction (FIG. 1B) is performed which a two-dimensional imagewise signal is transformed into a one-dimensional digital signal train S(x).

Denoted at 8 in FIG. 1A is a position detecting device in which the pattern matching operation is performed to the one-dimensional digital signal train S(x) produced by the integrating device 7, by using a template pattern having been memorized beforehand. The position detecting device outputs the address of S(x) having the highest degree of matching with the template pattern, to a central processing unit (CPU) 9. This output signal represents the mark position determined with reference to the image pickup surface of the image pickup device 5, and the CPU 9 then calculates the position $a_{x1}$ of the wafer mark M1x with respect to the reticle R on the basis of the relative position of the image pickup device 5 and the reticle R, having been detected beforehand.

With the process described above, any positional deviation of the first measurement shot with respect to the X direction is measured. Thereafter, the CPU 9 operates to drive the X-Y stage 11 so that a Y-direction measurement mark M1y of the first measurement shot comes into the range of the viewfield of the Y-direction alignment optical system. Then, with a process similar to that of the X-direction measurement, any positional deviation $a_{y1}$ with respect to the Y direction is measured.

With the process described above, the measurement of the first measurement shot S1 is completed. Then, the CPU 9 operates to measure any positional deviation of a second measurement shot S2 with respect to the X and Y directions, in a similar manner as that of the first measurement shot. Subsequently, measurement is repeated in a similar way, until measurements of the measurement shots of a predetermined number n (n=4 in FIG. 2 example) are completed. Positional deviations $a_{xi}$ and $a_{yi}$ (i=1, 2, ... and n) measured in relation to these measurement shots are memorized.

On the basis of the positional deviations obtained in this manner with respect to the measurement shots, the CPU 9 then operates to relatively align the wafer W with the reticle R.

More specifically, when the design mark position $d_i=[d_{xi}, d_{yi}]^T$ of each measurement shot is to be superposed through a correction transformation upon the actual mark position $a_i=[a_{xi}, a_{yi}]^T$ obtained by the wafer mark measurement, and if the relationship between $d_i$ and the corrected position $g_i=[g_{xi}, g_{yi}]^T=[a_{xi}+e_{xi}, a_{xi}+e_{xi}]^T$ including the remainder of correction $e_i=[e_{xi}, e_{yi}]^T$, is represented by an equation:

$$g_i = Ad_i + S \tag{1}$$

then the CPU 9 operates to calculate such transformation parameters A and S that minimize the square sum of the remainder of correction $e_i$ being denoted by:

$$\Sigma |e_i|^2.$$

Subsequently, the CPU 9 operates to drive the X-Y stage in accordance with transformation parameters as determined by A and S, to execute step-and-repeat motion effective to minimize the error between the measured mark position and the design mark position. In this manner, exposures of all the shots defined on the wafer are executed.

Here, A and S are expressed as follows:

$$A = \begin{pmatrix} 1+\alpha_x & 0 \\ 0 & 1+\alpha_y \end{pmatrix} \begin{pmatrix} \cos\theta_y & -\sin\theta_y \\ \sin\theta_x & \cos\theta_x \end{pmatrix} \tag{2}$$

-continued $$S = \begin{pmatrix} s_x \\ s_y \end{pmatrix}$$

where $\alpha_x$ and $\alpha_y$ denote elongations of the wafer in the X and Y directions, respectively, and $\theta_x$ and $\theta_y$ denote X-axis and Y-axis rotational components of the shot array. Also, S denotes a translational deviation of the wafer as a whole. In the method described above, positional deviation measurement is not executed with respect to all the exposure shots but, rather, the alignment operation is done with respect to only a limited number of sample shots. It is therefore effective to improve the throughput of the exposure apparatus. However, the relationship as represented by equation (1) is linear, including the error factors of translation, rotation and elongation/contraction of the wafer W. Actually, some of wafers to be processed in the semiconductor device manufacturing processes may have local deformation. Thus, with the approximation to the wafers as a whole on the basis of such linear equation, sufficient precision is difficult to obtain.

This problem may be solved by dividing the surface of a wafer into plural regions with respect to each of which a transformation parameter is determined, such that for exposure of a certain region the parameter determined in relation to that region is used to control the step-and-repeat motion of the X-Y stage. With this method, however, in each region the measurements to plural sample shots are necessary. Thus, the throughput of the exposure apparatus decreases.

SUMMARY OF THE INVENTION

It is accordingly an object of the present invention to provide an improved alignment method or alignment system which is free from the problems as described above.

More specifically, it is an object of the present invention to provide an alignment method or alignment system, of the type that a substrate to be processed has a plurality of zones to be aligned and that the alignment method or alignment system is used to align the substrate as a whole on the basis of plural zones selected out of all the zones of the substrate, the alignment method or alignment system of the present invention being particularly effective to assure high alignment precision as well as high throughput even to such a substrate in which measured values of measurement zones and design positions of them are not in a fixed relationship represented by a predetermined transformation equation.

In accordance with a first aspect of the present invention, there is provided an alignment method wherein substrates each having zones, to be aligned and being disposed in accordance with a predetermined array, are supplied sequentially and wherein in each substrate the zones are brought into alignment with a predetermined reference position sequentially, said method comprising: a first step for measuring in sequence deviations of positions of zones of a first substrate with respect to positions determined in accordance with the predetermined array, and for detecting the actual array of the zones through the measurement; a second step for determining, in terms of a predetermined transformation parameter, the relationship between the predetermined array and the actual array detected in said first step, and for determining a transformation parameter for the first substrate effective to minimize an error; a third step for detecting and memorizing an error between the actual array and an array determined in accordance with the transformation parameter of the first substrate; and a fourth step for aligning, with respect to the predetermined reference position, a second substrate having zones of substantially the same array as the first substrate, by using the memorized error as an alignment correction value.

The fourth step may comprise determining a transformation parameter for the second substrate in the same manner as in the first and second steps, and using the determined transformation parameter of the second substrate as well as the error memorized in the third step, as the alignment correction value for the second substrate.

The third step may comprise detecting a zone having an error larger than a predetermined value, and determining again a transformation parameter for the first substrate in the same manner as the second step while excluding the measured value of the detected zone.

The first step may comprise measuring in sequence deviations of the positions of zones of a predetermined combination, out of the zones of the first substrate, with respect to the positions determined in accordance with the predetermined array.

The third step may comprise determining an error of a zone, not measured in the first step, on the basis of the error of a zone measured in said first step.

The alignment method may further comprise a fifth step for measuring in sequence deviations of the positions of zones of a second combination different from the first-mentioned combination, with respect to the positions determined in accordance with the predetermined array, and a sixth step for determining and memorizing errors of the zones of the second combination essentially in the same manner as the second and third steps.

The fourth step may comprise comparing the errors of the first combination and the errors of the second combination, and selecting one of the first and second combinations.

The fourth step may comprise comparing minimums of the errors of the first and second combinations.

The fourth step may comprise comparing least square averages of the errors of the first and second combinations.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 3:
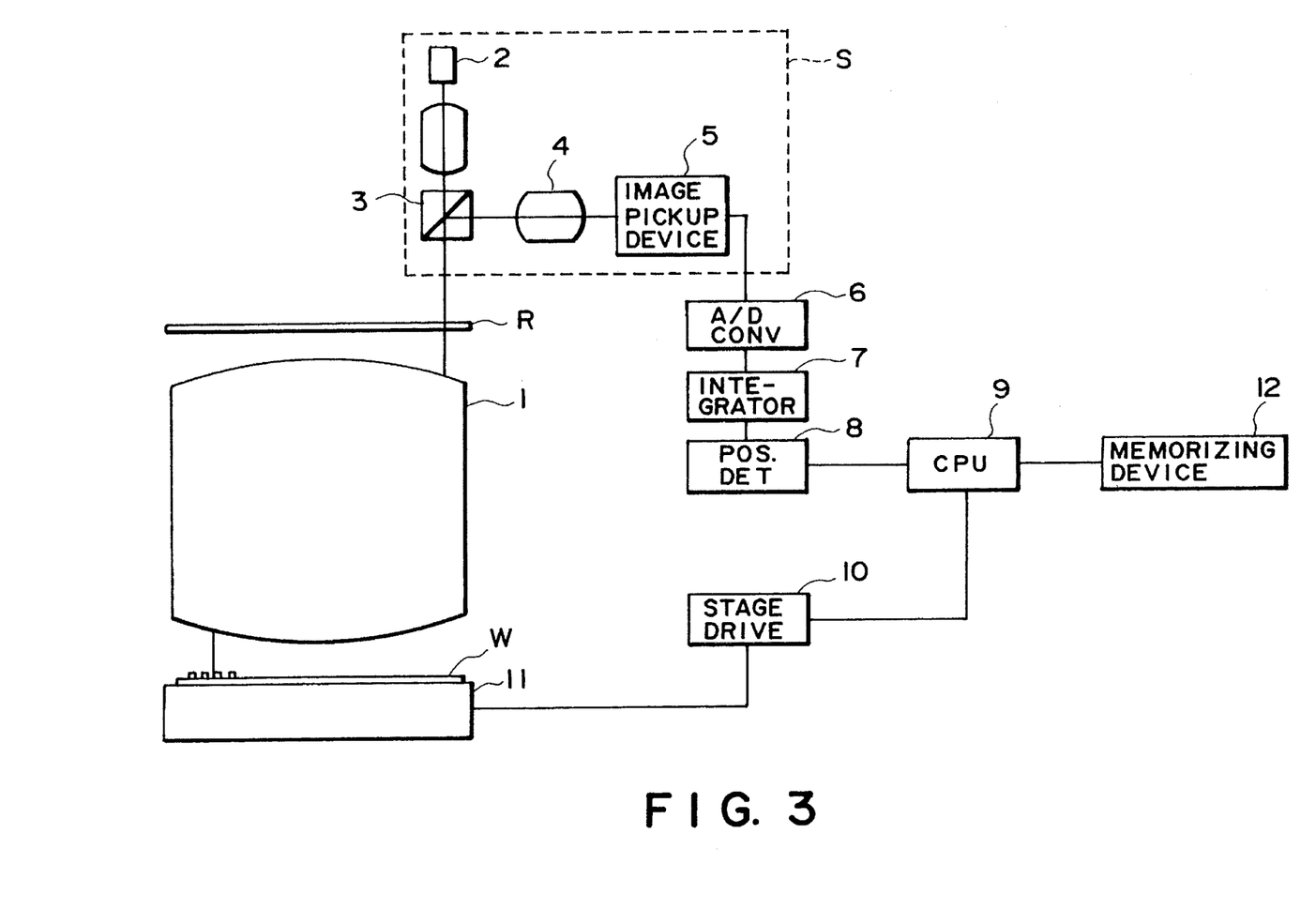
FIG. 3 is a schematic view of an alignment system according to an embodiment of the present invention.

FIG. 3 illustrates in a schematic view an alignment system according to a first embodiment of the present invention. In the arrangement illustrated, an alignment optical system S, an A/D converter 6, an integrating device 7 and a position detecting device 8 have a similar structure as those of the FIG. 1A example, and a detailed description of them will be omitted here. It is to be noted that, in this embodiment, a memorizing device 12 is added as compared with the structure of the FIG. 1A example. The alignment process to be done in this embodiment will be explained below with reference to FIGS. 3, 4A and 4B.

A wafer W1 is conveyed onto an X-Y stage 11 by means of a wafer conveying device (not shown). In response, a CPU 9 supplies a command to a stage driving device 10 to cause it to drive the X-Y stage 11, so that an alignment mark M1x formed in relation to a first measurement shot (first measurement sample) S1 (FIG. 4A) is positioned within the range of viewfield of the alignment optical system S (namely, at the sample position). A light beam projected by an alignment illumination system 2, providing non-exposure (non-sensitizing) light, passes through a beam splitter 3, a reticle R and a projection optical system 1, and it illuminates the alignment mark M1x. The alignment mark M1x comprises a grating mark such as illustrated in FIG. 1B. The A/D converter 6, the integrating device 7 and the position detecting device 8 then operate to detect the relative positional deviation of the mark M1x with respect to the reticle R, essentially in the same manner as described with reference to the FIG. 1A example. Subsequently, the CPU 9 operates to drive the X-Y stage 11 so that a Y-direction alignment mark M1y comes into the range of viewfield of the alignment optical system S. Any relative positional deviation of the mark M1y with respect to the reticle R is then detected in a similar manner as that of the mark M1x.

Figure 4A:
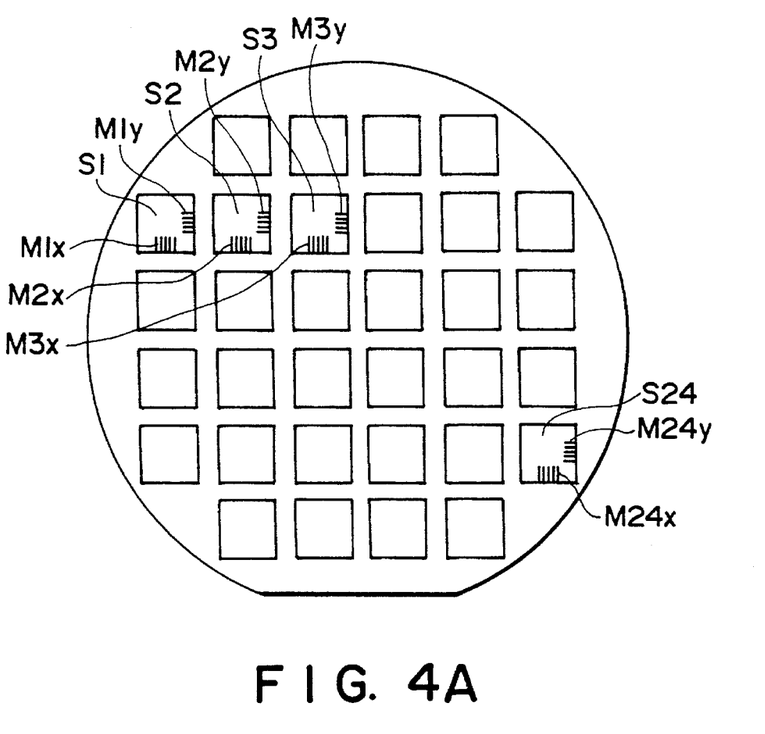
FIGS. 4A and 4B are plan views, respectively, each showing sample positions to be measured with the alignment system of the FIG. 3 embodiment.

After this, the CPU 9 operates to move the X-Y stage 11 so that an X-direction measurement mark M2x of a second measurement shot S2 comes into the range of viewfield of the alignment optical system S. Then, in a similar way as the measurement to the shot S1, measurements of the positional deviations in the X and Y directions are performed with respect to those shots S3, S4, ... and S24 defined on the wafer W1. FIG. 4A illustrates the shots on the wafer W1.

When the design mark position $d_i=[d_{xi}, d_{yi}]^T$ of each measurement shot is to be superposed through a correction transformation upon the actual mark position $a_i=[a_{xi}, a_{yi}]^T$ obtained by the wafer mark measurement, and if the relationship between $d_i$ and the corrected position $g_i=[g_{xi}, g_{yi}]^T=[a_{xi}+e_{xi}, a_{xi}+e_{xi}]^T$ including the remainder of correction $e_i=[e_{xi}, e_{yi}]^T$, is represented by an equation:

$$g_i = B\theta d_i + S \quad (3),$$

then the CPU 9 operates to calculate such transformation parameters B, θ and S that minimize the squared sum of the remainder of correction $e_i$ being denoted by:

$$V = \frac{1}{n} \Sigma |e_i|^2 \ (i = 1, 2, \ldots \text{ and } 24) \quad (4)$$

Here, parameters B, θ and S are expressed as follows:

$$B = \begin{pmatrix} 1+\beta_x & 0 \\ 0 & 1+\beta_y \end{pmatrix} \quad (5)$$

$$\theta = \begin{pmatrix} \cos\theta_y & -\sin\theta_y \\ \sin\theta_x & \cos\theta_x \end{pmatrix}$$

$$S = \begin{pmatrix} s_x \\ s_y \end{pmatrix}$$

wherein $\beta_x$ and $\beta_y$ denote elongations of the wafer in the X and Y directions, respectively, and $\theta_x$ and $\theta_y$ denote X-axis and Y-axis rotational components of the shot array. Also, S denotes a translational deviation of the wafer as a whole. These transformation parameters represent error factors of a magnification component, a rotational component and a translational component, from an ideal position, of a pattern formed on the wafer W1. The CPU 9 stores into the memorizing device 12 the remainder $E=(e_1, e_2, \ldots \text{ and } e_{24})$ based on the determined parameters. Since the transformation equation (3) is a linear equation, this remainder corresponds to the non-linear component of the shot array defined on the wafer W1. For wafers of the same lot, it is considered as being substantially constant. Thus, the CPU 9 operates to execute the step-and-repeat motion of the X-Y stage 11 in accordance with a grid obtained by transforming the design shot array grid on the basis of the determined transformation parameters, whereby shots of the wafer W1 are exposed in sequence. After exposures of all the shots are completed, the wafer W1 is moved into a wafer accommodating carrier (not shown) by means of the wafer conveying device.

Figure 4B:
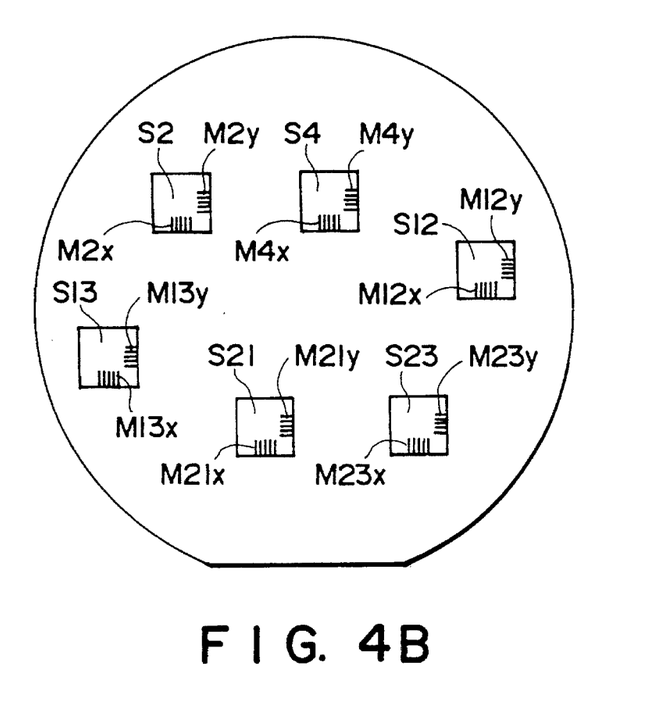
Figure 5:
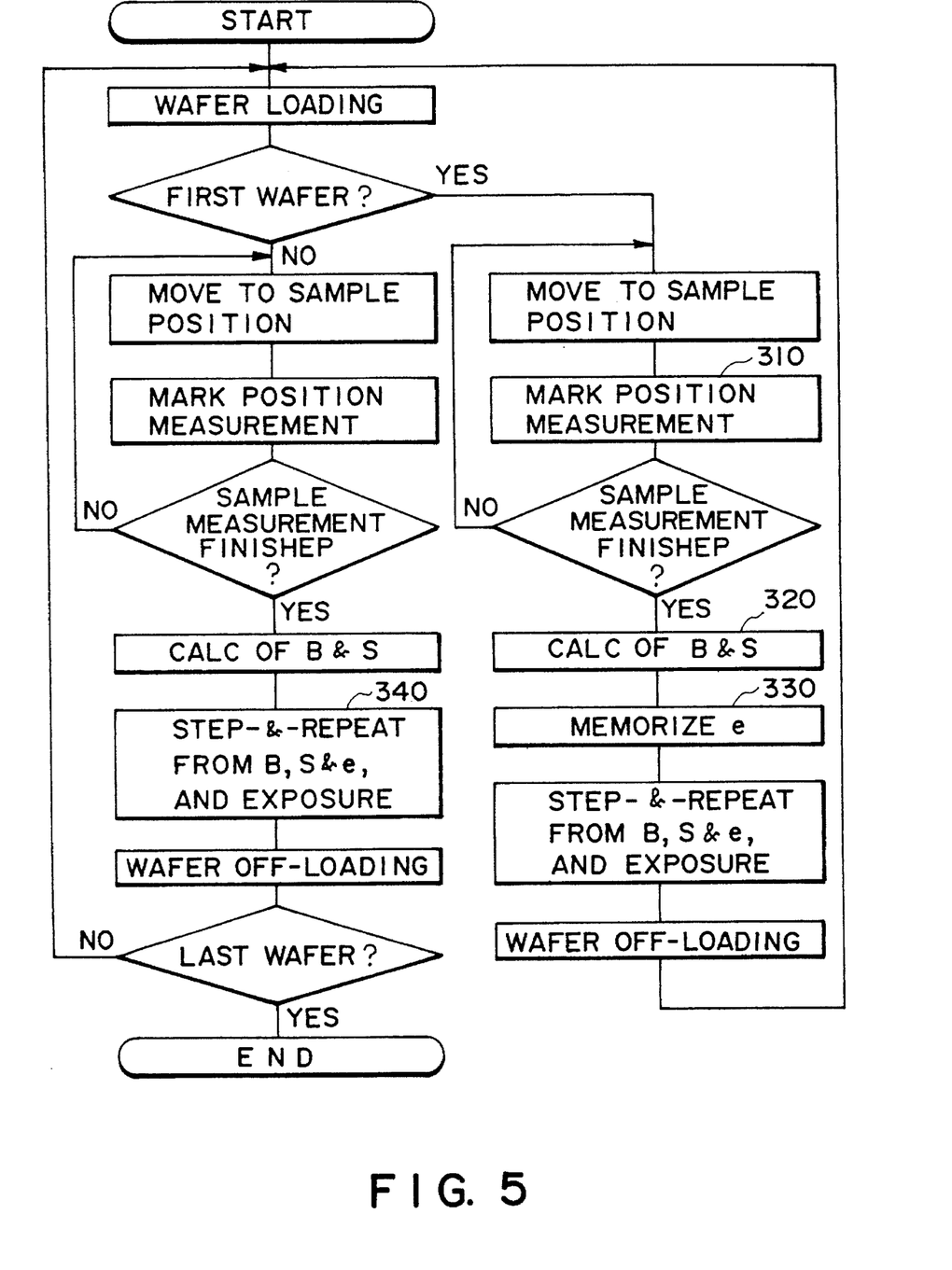
FIG. 5 is a flow chart of the operation of the alignment system of the FIG. 3 embodiment.

Then, the CPU 9 operates to place a second wafer W2, to be processed subsequently, on the X-Y stage 11 by using the wafer conveying device. For the second wafer, measurements are made sequentially to the alignment marks of those shots as shown in FIG. 4B, in a similar manner as described, and deviations $a_{2i}=[a_{2xi}, a_{2yi}]^T$ of those shots with respect to the X and Y directions are detected. The CPU 9 determines transformation parameters $B_2$, $\theta_2$ and $S_2$ in a similar manner as of the wafer W1. Then, by using the non-linear error component $E=e_1, e_2, \ldots$ and $e_{24}$ stored in the memorizing device 12, the CPU 9 calculates $$g_{2i} = B_{21}\theta_2 d_i + S_2 + e_i \quad (6)$$

and executes the step-and-repeat motion of the X-Y stage 11 in accordance with the shot array based on this. In this manner, all the shots of the second wafer are exposed. Here, if the difference between B and $B_2$ is large, the exposure operation may not be started but an alarm may be outputted. Alternatively, the term $e_i$ in equation (6) may be substituted by $(B_2/B)e_i$ and the shot array may be determined. To a third wafer and to the remaining wafers of the same lot, sequential processes of measurement, step-and-repeat motion and exposure are made in the same manner as of the wafer W2. The number of wafers in one lot has been memorized in the CPU 9 beforehand. If a wafer of a different lot is introduced, the non-linear error component of it is measured and memorized in the same process as having been performed on the first wafer W1. For the remaining wafers in the same (second) lot, a similar process as that performed on the wafer W2 is repeated. The operations described above is illustrated in the chart of FIG. 5.

Figure 6A:
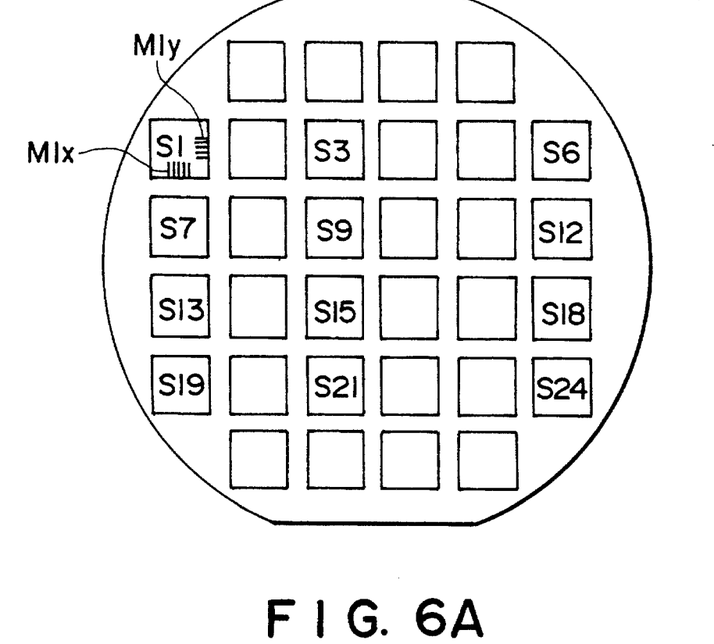
FIGS. 6A and 6B are plan views, respectively, each showing sample positions to be measured in accordance with a second embodiment of the present invention.

A second embodiment of the present invention will now be explained. In the first embodiment, measurement is made of all the shots defined on first one of the wafers of one lot to measure non-linear errors. In the second embodiment, however, measurement is made only to those shots indicated in FIG. 6A by the character S with a numeral. In this example, if the number of measurement shots is 1, then non-linear errors detected are expressed by $E_s=(e_{s1}, e_{s2}, \ldots$ and $e_{sl})$. The sequences of processing a second wafer and the remaining wafers by using obtained $E_s$, will be explained below.

Figure 6B:
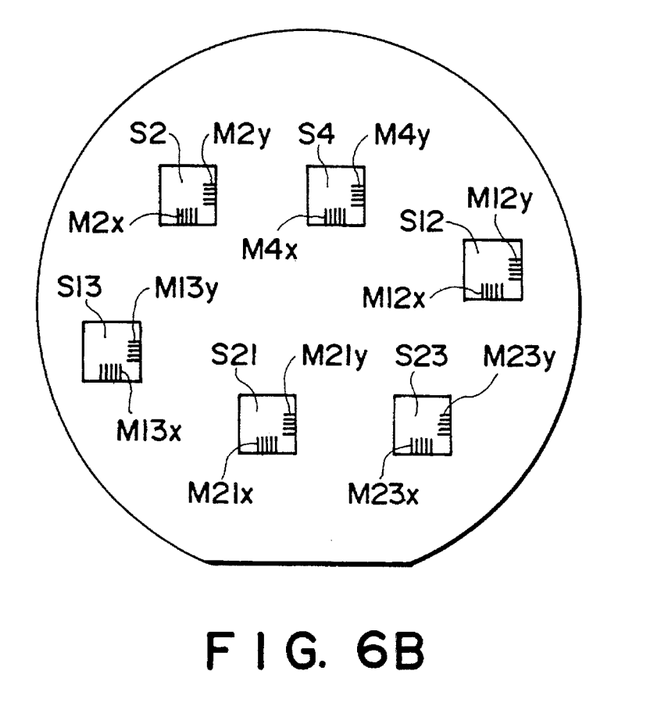

The CPU 9 controls the wafer conveying device to place a wafer W2, to be processed subsequently, on the X-Y stage 11. For this wafer, a measurement is performed sequentially to those shots as illustrated in FIG. 6B, in a similar manner as has been described, whereby deviations $a_{s2i}=[a_{s2xi}, a_{s2yi}]^T$ of those shots with respect to the X and Y directions are detected. Then, in a similar manner as that of the first wafer W1, transformation parameters $B_{s2}$, $\theta_{s2}$ and $S_{s2}$ are determined. Here, since errors $E_s$ obtained above are not based on measurements to all the shots, the CPU 9 calculates errors of the positions of those shots not having been measured, through interpolation. If a non-linear error $e_{sk}$ of a k-th measurement shot, obtained from a first one W1 of the wafers of one lot, is $$e_{sk} = \begin{pmatrix} f_x(x_k, y_k) \\ f_y(x_k, y_k) \end{pmatrix}, \quad (7)$$

the CPU 9 calculates and memorizes spline functions $C_x(x, y)$ and $C_y(x, y)$ satisfying the following relations:

$$C_x(x_k, y_k)=f_x(x_k, y_k)$$

$$C_y(x_k, y_k)=f_y(x_k, y_k) \quad (8).$$

Figure 7A:
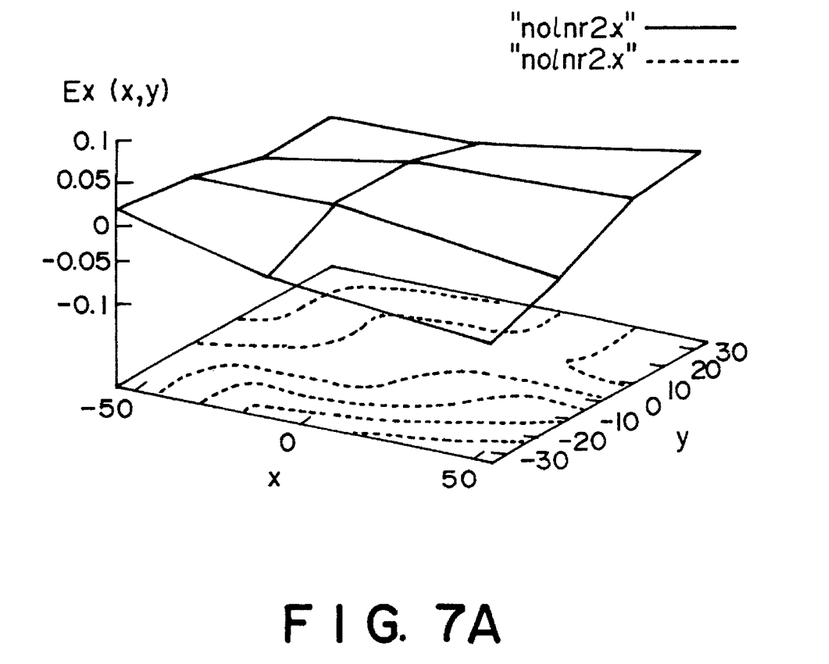
FIGS. 7A and 7B are graphs, respectively, showing examples of non-linear components in the second embodiment.
Figure 7B:
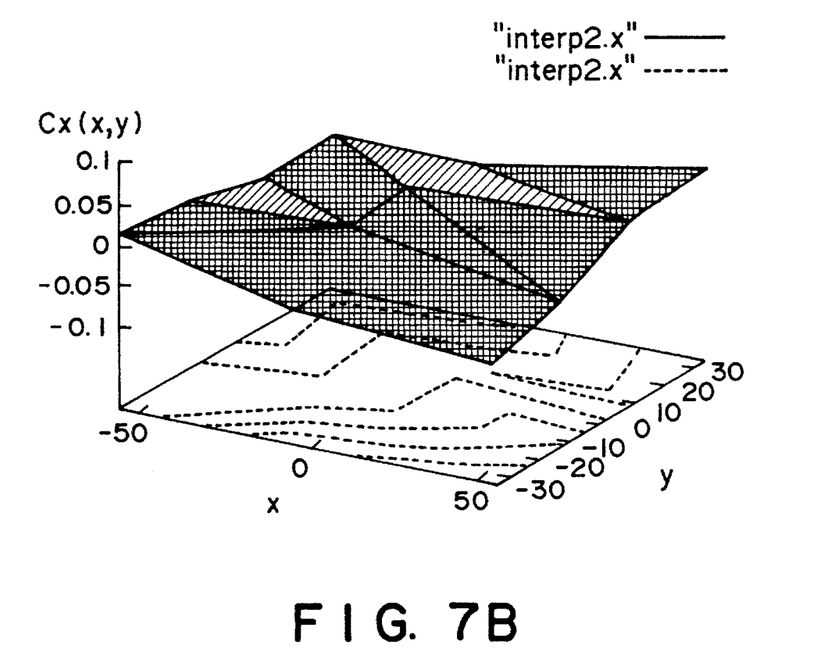

FIGS. 7A and 7B illustrates the non-linear errors obtained by the measurement and those being spline interpolated.

By using the obtained functions $C_x(x, y)$ and $C_y(x, y)$, the CPU 9 executes the interpolation while taking the position of an i-th shot of an n-th wafer as $$g_{ni}=B_n\theta_n d_i S_n+C_i \quad (9).$$

where $$Ci = \begin{pmatrix} C_x(x_i, y_i) \\ C_y(x_i, y_i) \end{pmatrix}$$

In this manner, the number of measurement shots of a first one of the wafers of one lot is reduced, and this reduces the time necessary for the measurement and thus improves the throughput of the exposure apparatus. The above-described operations of the present embodiment are illustrated in the flow chart of FIG. 8.

A third embodiment of the present invention will be explained below. In the first and second embodiments, the measurement shots are predetermined. In the third embodiment, however, optimum measurement shots are selected on the basis of non-linear errors obtained through measurement.

After a first one W1 of the wafers of one lot is placed on the X-Y stage 11, the CPU 9 operates to calculate non-linear errors, essentially in the manner as has been described with reference to the second embodiment, with respect to some combinations (sample patterns) of measurement shots as illustrated in FIGS. 9A–9D. In the illustrated example, four patterns (sample patterns) are selected, and thus four type of linear errors $E_{s1}$, $E_{s2}$, $E_{s3}$ and $E_{s4}$ are obtained. From these non-linear errors, the CPU 9 determines a sample pattern $SP_{min}$ that satisfies the following relation:

$$SP_{min}=\{k|\min(E_{sk}), k=1, 2, 3, 4\} \quad (11)$$

where $$E_{sk}=\{\min(|e_{sj}|), j=1, 2, 3, \ldots, n\} \quad (12)$$

and where n is the number of the measurement shots of the corresponding measurement sample pattern. Alternatively, on the basis of the following condition:

$$SP_{min} = \{k|\min(\sigma_k), \quad k = 1, 2, 3, 4\}$$

$$\sigma_k = \sum_{j=1}^{n} (e_{sj})^2 \quad \text{(where } e_{sj} \subset E_{sk}\text{)},$$

the minimum non-linear error of each sample pattern may be determined, and the sample pattern selection may be made on the basis of comparison of least square values.

In any event, the CPU 9 memorizes the selected sample pattern $SP_{min}$ as the measurement shot pattern to be used in the alignment operation for the wafers of the lot, just to be processed. The subsequent alignment operation is performed essentially in the same way as of the second embodiment. When all the wafers of the one lot are processed and they are replaced by those of a second lot, selection of a suitable measurement shot pattern is performed on the wafers of the second lot. The operations described above are illustrated in the flow chart of FIG. 10.

In the example described just above, some measurement shot patterns are determined beforehand and, of them, a suitable pattern is selected. However, as an alternative, a suitable measurement shot pattern may be determined on the basis of the distribution of non-linear errors obtained through measurement. This will be explained below in detail.

Figure 11A:
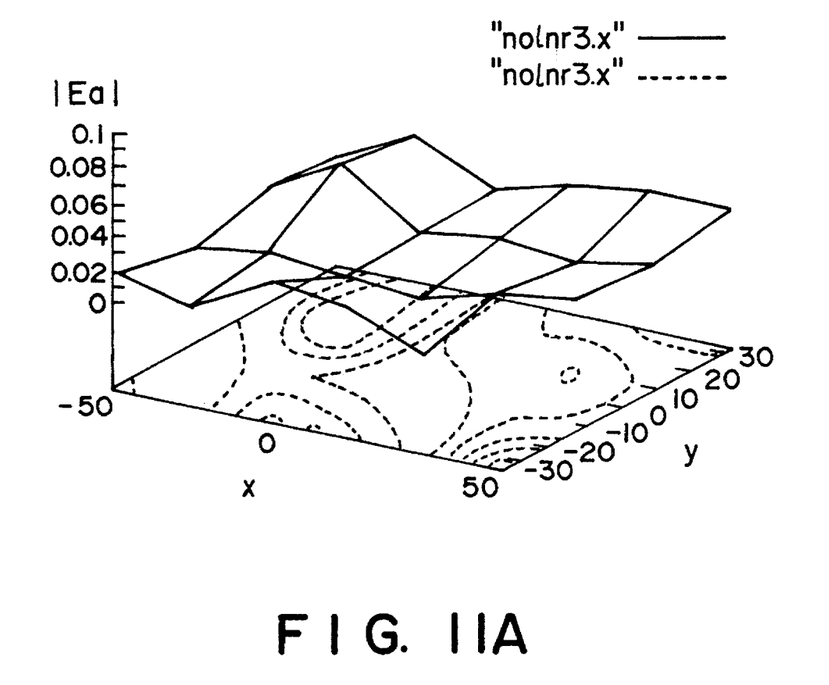
FIGS. 11A and 11B are graphs, respectively, showing the absolute values of non-linear components and a corresponding contour line map, in a fourth embodiment of the present invention.
Figure 11B:
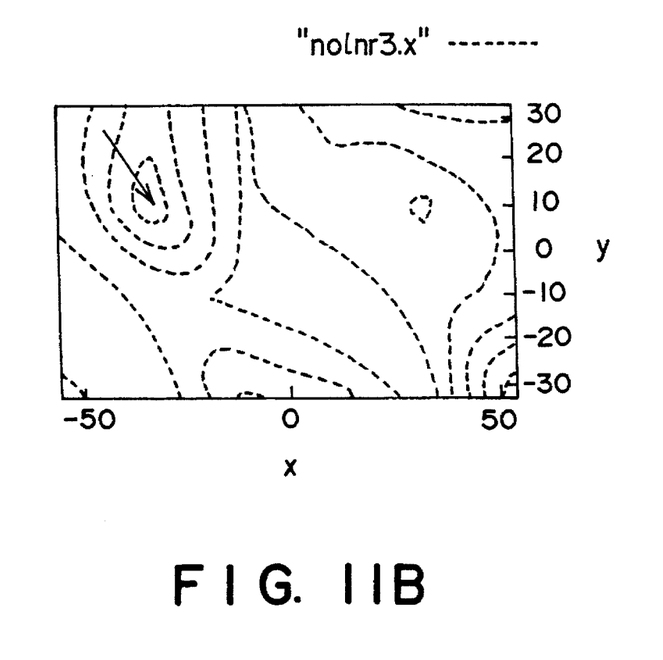

After a first one W1 of the wafers of one lot is placed on the X-Y stage 11, the CPU 9 operates to measure positional deviations in X and Y directions, the measurement being done sequentially in accordance with the measurement shot pattern as shown in FIG. 4A, and to determine transformation parameters $B_a$, $\theta$ and $S_a$ on the basis of the actual mark position $a_i$ and the design mark position $d_i$, essentially in the same manner as that of the first embodiment. Then, the distribution in magnitude of non-linear errors $E_a$ determined in accordance with these transformation parameters, is detected by calculation. In FIGS. 11A and 11B, the thus obtained non-linear errors $|E_a|$ are illustrated in a contour map. Subsequently, the CPU 9 operates to determine those measurement shot positions, out of errors $|E_a|$, having a value greater than a predetermined threshold $t_h$. As an example, the arrow in FIG. 11B indicates a measurement shot position having a non-linear error larger than the threshold. Here, if this sample shot position is denoted by $p=(x_p, Y_p)$, the transformation parameter calculation is made again while excluding the measured values of those measurement shots lying within the range of a radius r about the position (center) p. The non-linear errors $E_r$ based on the re-calculated transformation parameters are stored in the memory device 12. As for a second wafer and the remaining wafers, they are processed in a similar manner as of the first embodiment, but in the processing, those measurement shots in which in the case of the wafer W1 measurement shots are excluded so as not exceed the threshold $t_h$ are used. Here, the threshold $t_h$ and the radius r may be suitably selected while taking into account the alignment precision required and/or the throughput desired.

In the example described above, even if wafers in the same lot have local deformation, zones in such locally deformed portion are not used as the measurement shots. This effectively avoids degradation of precision of approximation where linear approximation is done to the wafers as a whole. Additionally, with respect to the portion near the locally deformed portion, interpolation is done by using non-linear components measured beforehand. As a result, a very high alignment precision is assured.

While the invention has been described with reference to the structures disclosed herein, it is not confined to the details set forth and this application is intended to cover such modifications or changes as may come within the purposes of the improvements or the scope of the following claims.

What is claimed is:

1. An alignment method for sequentially supplying substrates, each having zones, to be aligned, and being disposed in accordance with a predetermined array, and for aligning the zones in each substrate with a predetermined reference position sequentially, said method comprising:

a first step for measuring in sequence deviations in the positions of zones of a first substrate with respect to positions determined in accordance with the predetermined array, and for detecting the actual array of the zones through the measurement;

a second step for determining, in terms of a predetermined transformation parameter, the relationship between the predetermined array and the actual array detected in said first step, and for determining a transformation parameter for the first substrate effective to minimize an error between the predetermined array and the detected actual array;

a third step for detecting and storing the error between the actual array and an array determined in accordance with the transformation parameter of the first substrate; and a fourth step for aligning, with respect to the predetermined reference position, a second substrate having zones of substantially the same array as the first substrate, by using the stored error as an alignment correction value.

2. A method according to claim 1, wherein said fourth step comprises the step of determining a transformation parameter for the second substrate in the same manner as of said first and second steps, and using the determined transformation parameter of the second substrate as well as the error stored in said third step, for the alignment correction value for the second substrate.

3. A method according to claim 1, wherein said third step comprises the steps of detecting a zone having an error larger than a predetermined value, and determining again a transformation parameter for the first substrate in the same manner as said second step while excluding the measured value of the detected zone.

4. A method according to claim 1, wherein said first step comprises the steps of measuring in sequence deviations in the positions of zones of a first predetermined combination of zones, of the zones of the first substrate, with respect to the positions determined in accordance with the predetermined array.

5. A method according to claim 4, wherein said third step comprises the step of determining an error of a zone, not measured in said first step, on the basis of the error of a zone measured in said first step.

6. A method according to claim 4, further comprising:

a fifth step for measuring in sequence deviations in the positions of zones of a second combination of zones different from the first predetermined combinations of zones, with respect to the positions determined in accordance with the predetermined array; and a sixth step for determining and storing errors of the zones of the second combination essentially in the same manner as of said second and third steps.

7. A method according to claim 6, wherein said fourth step comprises the step of comparing the errors of the first combination and the errors of the second combination, and selecting one of the first and second combinations.

8. A method according to claim 7, wherein said fourth step comprises the step of comparing the minimums of the errors of the first and second combinations.

9. A method according to claim 7, wherein said fourth step comprises the step of comparing least square averages of the errors of the first and second combinations.

10. An alignment system for sequentially supplying substrates each having zones, to be aligned and being disposed in accordance with a predetermined array, and for aligning the zones in each substrate with a predetermined reference position sequentially, said system comprising:

position measuring means for measuring in sequence deviations in the positions of zones of a first substrate with respect to positions determined in accordance with the predetermined array, and for detecting the actual array of the zones through the measurement;

parameter determining means for determining, in terms of a predetermined transformation parameter, the relationship between the predetermined array and the actual array detected with said position measuring means, and for determining a transformation parameter for the first substrate effective to minimize an error between the predetermined array and the detected actual array;

memory means for detecting and storing an error between the actual array and an array determined in accordance with the transformation parameter of the first substrate; and aligning means for aligning, with respect to the predetermined reference position, a second substrate having zones of substantially the same array as the first substrate, by using the stored error as an alignment correction value.

11. A system according to claim 10, wherein said aligning means comprises control means for determining a transformation parameter for the second substrate in the same manner as of said parameter determining means, and using the determined transformation parameter of the second substrate as well as the error stored in said memory means for the alignment correction value for the second substrate.

12. A system according to claim 10, wherein said memory means comprises means for detecting a zone having an error larger than a predetermined value, and wherein said parameter determining means determines again a transformation parameter for the first substrate while excluding measured value of the detected zone.

13. A system according to claim 11, wherein said position measuring means measures deviations in the positions of zones of a predetermined first combination of zones of the zones of the first substrate, with respect to the positions determined in accordance with the predetermined array.

14. A system according to claim 13, wherein said memory means comprises means for determining an error of a zone, not measured with said position measuring means, on the basis of the error of a zone measured with said position measuring means.

15. A system according to claim 13, wherein said position measuring means measures in sequence deviations in the positions of zones of a second combination different from the predetermined first combination, with respect to the positions determined in accordance with the predetermined array, and wherein said parameter determining means and said memory means cooperate to determine and store errors of the zones of the second combination.

16. A system according to claim 15, wherein said aligning means comprises comparing and determining means for comparing the errors of the first combination and the errors of the second combination, and for selecting one of the first and second combinations.

17. A system according to claim 16, wherein said comparing and determining means compares the minimums of the errors of the first and second combinations.

18. A system according to claim 16, wherein said comparing and determining means compares least square averages of the errors of the first and second combinations.

19. An exposure method for sequentially supplying wafers each having zones, to be aligned and being disposed in accordance with a predetermined array, and for aligning zones in each wafer with a predetermined reference position sequentially, and for projecting a pattern of a reticle onto the zones of each wafer for exposure thereof, said method comprising:

a first step for measuring in sequence deviations in the positions of zones of a first wafer with respect to positions determined in accordance with the predetermined array, and for detecting the actual array of the zones through the measurement;

a second step for determining, in terms of a predetermined transformation parameter, the relationship between the predetermined array and the actual array detected in said first step, and for determining a transformation parameter for the first wafer effective to minimize an error between the predetermined array and the detected actual array;

a third step for detecting and storing an error between the actual array and an array determined in accordance with the transformation parameter of the first wafer;

a fourth step for aligning, with respect to the predetermined reference position, a second wafer having zones of substantially the same array as the first wafer, by using the stored error as an alignment correction value, and then for transferring the pattern of the reticle onto the second wafer; and a fifth step of projecting a pattern of a reticle onto the zones of each wafer.

20. An exposure apparatus for sequentially supplying wafers each having zones, to be aligned and being disposed in accordance with a predetermined array and for aligning zones in each wafer with a predetermined reference position sequentially, and for projecting a pattern of a reticle upon each wafer for exposure thereof, said apparatus comprising:

a movable stage on which each wafer can be placed;

position measuring means for measuring in sequence deviations of positions of zones of a first wafer with respect to positions determined in accordance with the predetermined array, and for detecting the actual array of the zones through the measurement;

parameter determining means for determining, in terms of a predetermined transformation parameter, the relationship between the predetermined array and the actual array detected with said position measuring means, and for determining a transformation parameter for the first wafer effective to minimize an error between the predetermined array and the detected actual array;

memory means for detecting and storing an error between the actual array and an array determined in accordance with the transformation parameter of the first wafer; and aligning means for aligning, with respect to the predetermined reference position, a second wafer having zones of substantially the same array as the first wafer, by using the stored error as an alignment correction value;

projecting means for projecting a pattern of a reticle upon the first wafer; and a control system for transferring the pattern of the reticle onto the second wafer being aligned with respect to the reference position through said aligning means.

* * * * *

UNITED STATES PATENT AND TRADEMARK OFFICE
CERTIFICATE OF CORRECTION

PATENT NO. : 5,499,099
DATED : March 12, 1996
INVENTOR(S) : MAKOTO SATO, et al.

It is certified that error appears in the above-indentified patent and that said Letters Patent is hereby corrected as shown below:

<u>IN THE DRAWINGS</u>

<u>Sheet 5</u>

Figure 5, "FINISHEP" (both occurrences) should read --FINISHED--.

<u>Sheet 8</u>

Figure 8:
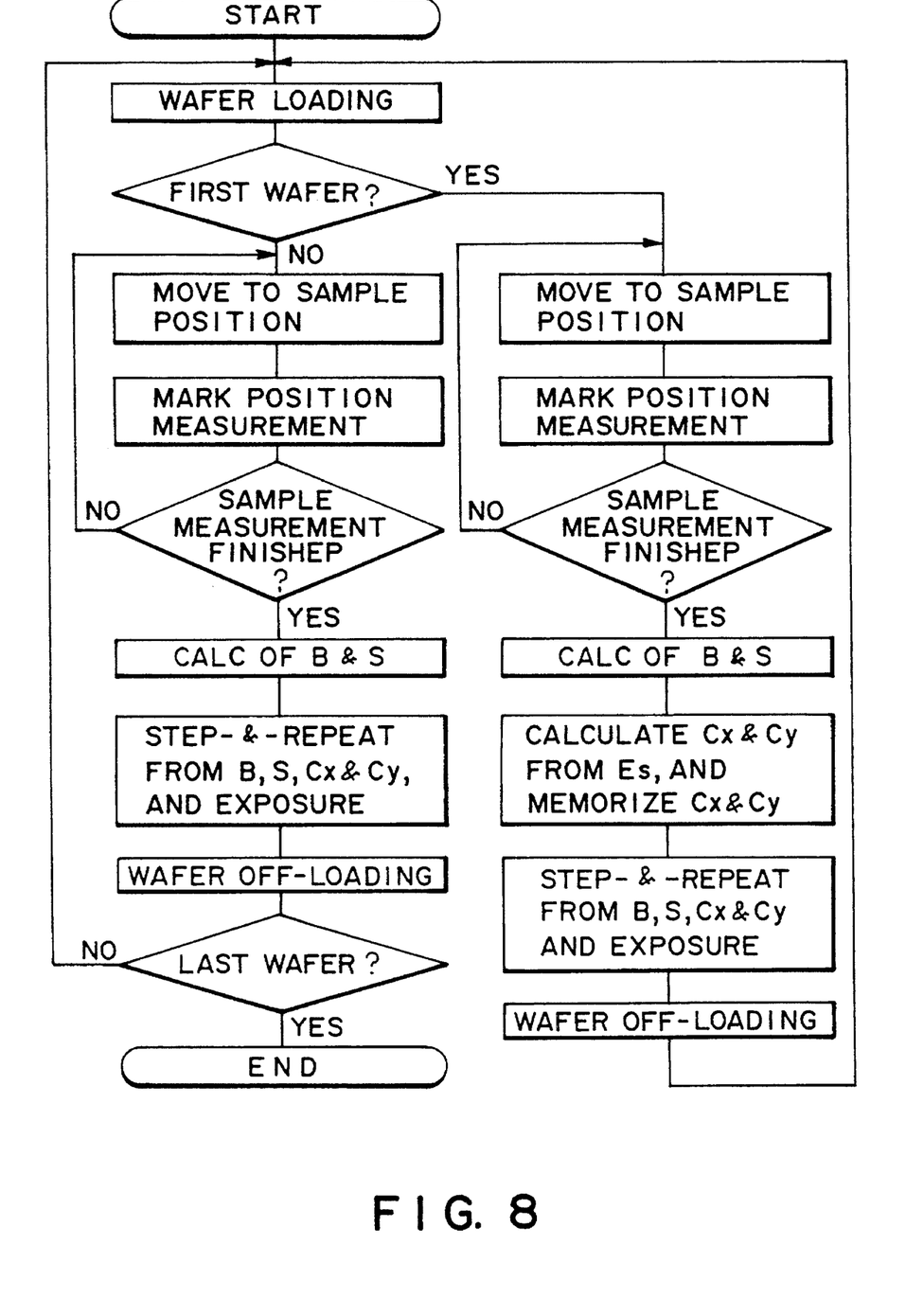
FIG. 8 is a flow chart of the operation of the alignment system according to the second embodiment.
Figure 9A:
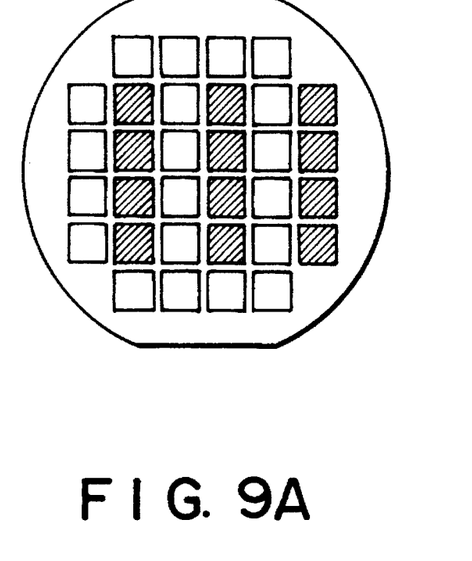
FIGS. 9A, 9B, 9C and 9D are plan views, respectively, each showing sample positions in a third embodiment of the present invention.
Figure 9B:
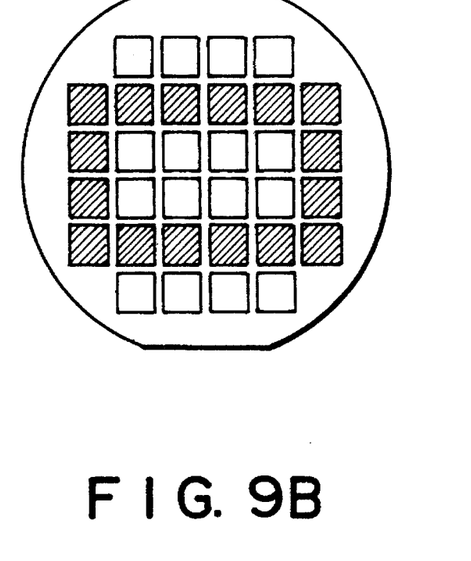
Figure 9C:
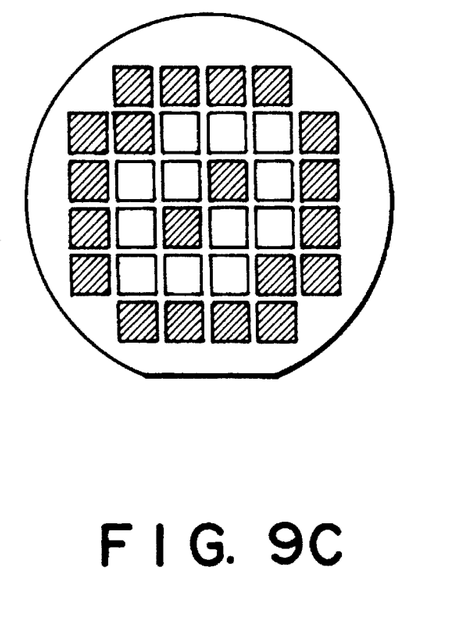
Figure 9D:
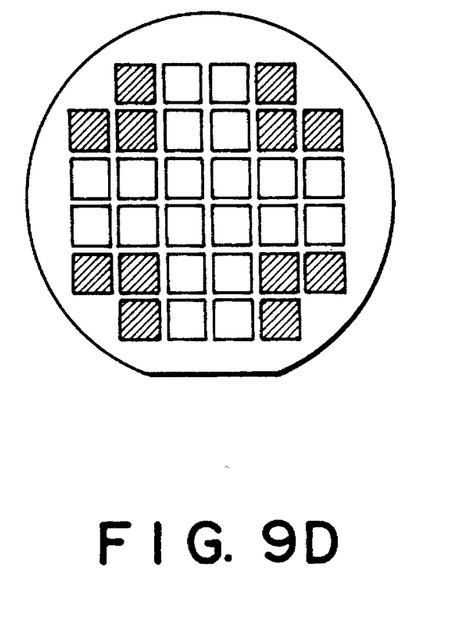

Figure 8, "FINISHEP" (both occurrences) should read --FINISHED--.

<u>Sheet 10</u>

Figure 10:
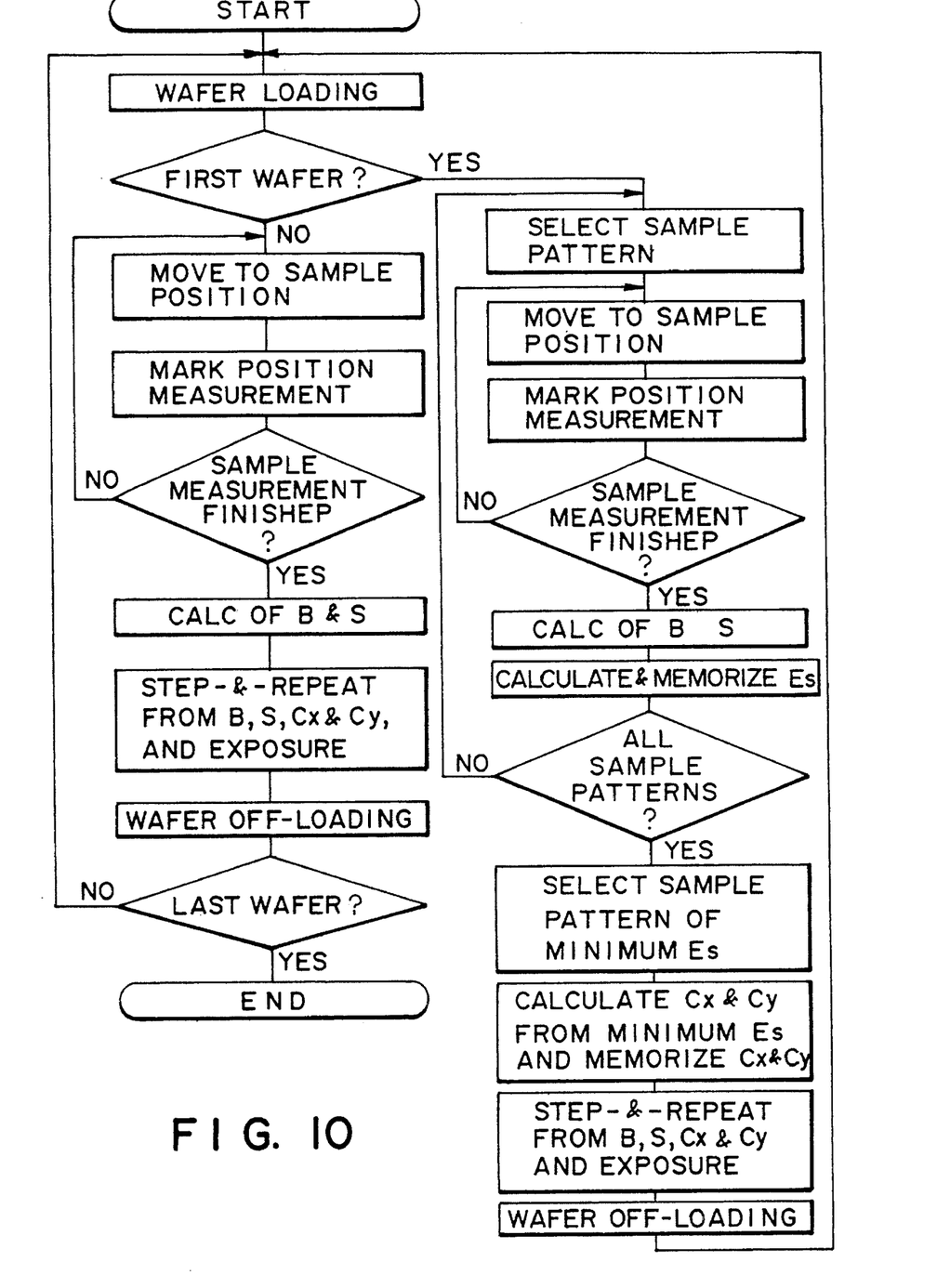
FIG. 10 is a flow chart of the operation of the alignment system according to the third embodiment.

Figure 10, "FINISHEP" (both occurrences) should read --FINISHED--.

<u>COLUMN 1</u>

Line 67, "which" should read --by which--.

<u>COLUMN 6</u>

Line 67, "is" should read --are--.

<u>COLUMN 7</u>

Line 36, "illustrates" should read --illustrate--.
   Line 42, "$g_{ni} = B_n \theta_n d_i S_n + C_i$" should read --$g_{ni} = B_n \theta_n d_i + S_n + C_i$--.
   Line 67, "type" should read --types--.

UNITED STATES PATENT AND TRADEMARK OFFICE
CERTIFICATE OF CORRECTION

PATENT NO. : 5,499,099  Page 2 of 2
DATED : March 12, 1996
INVENTOR(S) : MAKOTO SATO, et al.

It is certified that error appears in the above-indentified patent and that said Letters Patent is hereby corrected as shown below:

COLUMN 9

Line 44, "of" should be deleted.

COLUMN 10

Line 6, "of" should be deleted.
Line 46, "of" should be deleted.

Signed and Sealed this

Twenty-third Day of July, 1996

Attest:

BRUCE LEHMAN

*Attesting Officer*  *Commissioner of Patents and Trademarks*